(12) United States Patent
Inada

(10) Patent No.: US 6,271,600 B1
(45) Date of Patent: *Aug. 7, 2001

(54) REDUNDANT WIRING APPARATUS AND A METHOD OF MAKING THE SAME

(75) Inventor: Katsuhiko Inada, Hyogo-ken (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,498

(22) Filed: Aug. 31, 1998

(30) Foreign Application Priority Data

Sep. 19, 1997 (JP) .................................. 9-255731

(51) Int. Cl.[7] .......................... H01L 23/48; H01L 23/52; H01L 29/40
(52) U.S. Cl. ............................. 257/784; 257/59
(58) Field of Search ................... 257/784, 59, 72, 257/758, 760; 349/54, 47

(56) References Cited

U.S. PATENT DOCUMENTS

| | | | |
|---|---|---|---|
| 5,235,272 | * 8/1993 | Henley | 324/158 |
| 5,600,460 | * 2/1997 | Yamamoto et al. | 349/54 |
| 5,714,770 | * 2/1998 | Kim | 257/59 |

FOREIGN PATENT DOCUMENTS

| | | |
|---|---|---|
| 5-053127 | * 3/1993 | (JP) . |
| 5-53127 | 3/1993 | (JP) . |

* cited by examiner

*Primary Examiner*—Olik Chaudhuri
*Assistant Examiner*—Phat X. Cao
(74) *Attorney, Agent, or Firm*—Pillsbury Winthrop LLP

(57) ABSTRACT

A redundant wiring apparatus used for a liquid crystal display apparatus and a method of a making the same are disclosed. The liquid crystal display device includes a switching circuit array substrate and a counter substrate provided opposite to the array substrate. Signal and scanning lines are disposed on the array substrate in a matrix form. The signal and scanning lines are connected pixel electrodes through the switching circuits formed on the array substrate. A display region and a surrounding region are provided on the array substrate. The signal and scanning lines have lead wires extending from the display region to the surrounding region. The lead wires are redundant in wiring structure in which a first wire, an insulation layer and a second wire are laminated. The first and second wires are electrically connected through connectors received in through-holes at both ends of the first wire. Repair portions of the first and second wires are provided in the vicinity of through-holes. The repair portions are not overlapped with each other for the convenience of repair. When the first or/and second wires of neighboring lead wires are sort-circuited, the repair portions of the first and second wires are cut off to repair by irradiating laser beams.

4 Claims, 5 Drawing Sheets

REDUNDANT WIRING APPARATUS AND A METHOD OF MAKING THE SAME

BACKGROUND OF THE INVENTION

This invention relates to a redundant wiring apparatus and a method of making the same. The invention also relates to a redundant wiring apparatus and a method of making a redundant wiring apparatus used for a thin film transistor array substrate of a flat panel display device, e.g., a liquid crystal display device.

Recent development of such a liquid crystal display device has focused on the features of small size, light weight and low power consumption. The liquid crystal display device includes a thin film transistor array substrate, a counter substrate and a liquid crystal layer held between the array and counter substrates. The array substrate is provided with an insulation substrate on which a plurality of signal lines and scanning lines are formed in matrix. Pixel electrodes are disposed in the region defined by the signal and scanning lines. The thin film transistors are formed as switching elements in the vicinities of the crossing points of the signal and scanning lines, respectively, and are connected with them through the pixel electrodes. The counter substrate, on the other hand, includes an insulation substrate to which counter electrodes made of transparent conductive films are attached.

The signal and scanning lines are extended out of a display region and are connected with electric power supplying electrodes formed at the surrounding edges of the array substrate. The electric power supplying electrodes are further connected to driver circuits provided outside the array substrate.

In the liquid crystal display device of this sort, it has been recently required that a peripheral frame portion of the display region is made as narrow as possible (the "narrow frame") to ensure the wide display region. Further, it is necessary to reduce the manufacturing cost and also to improve the production yield.

Where the liquid crystal display device, however, includes the narrow frame, spaces allocated to wires drawn from the display region are so limited that the wiring width and gap become narrow. As a result, open- and/or short-circuited wiring troubles are apt to easily take place in manufacturing.

To improve the reliability by preventing from such open-circuited wiring, a liquid crystal display device which has been available in the market includes signal lines drawn from the display region provided with a redundant, two-layer (parallel) wiring structure. The signal line consists of first and second laminated wires between which an insulation layer is held. Connectors passing through perforations in the isolation layer are provided to connect the first and second wires at both ends located in the display and near the connecting pads, respectively. Thus, with the structure, the signal lines are kept conductive even in the event that either one of the first and second wires is open-circuited. It improves the reliability on the signal lines.

Although the structure prevents the wires from being open-circuited, the short-circuited wiring trouble occur twice as many as that with single wire structure due to redundant wires. In the case of a liquid crystal display device with the narrow frame, the spaces allocated to the lead wires drawn from the display region are so narrow that short-circuited wiring troubles take place more readily.

It is quite difficult not only to detect apoint where such a short-circuited wiring trouble takes place but also to cut it. It is one of the critical factors to automate manufacturing processes of a liquid crystal display device.

SUMMARY OF THE INVENTION

One object of the present invention is to provide a high quality, high production yield, and low cost redundant wiring apparatus which is particularly suitable for the production of a thin film transistor (TFT) array substrate and a method of making a redundant wiring apparatus. The redundant wiring apparatus of this invention and the method thereof are particularly applicable to TFT array substrates for active matrix type liquid crystal display devices.

In order to achieve the object, a redundant wiring apparatus of the invention includes an insulation substrate, an insulation layer, a plurality of first wires formed between the insulation substrate and the insulation layer, a plurality of second wires formed on the insulation layer, the first and second wires each having repair portions in the vicinity of both ends of either one of the first and second wires, and connectors to electrically connect the first wires with the second wires at such both ends as set forth above.

The first wires are in parallel with the second wires with respect to the insulation layers. The first and second wires define a plurality of parallel wiring groups. The wiring redundancy is effective in repairing of the open-circuited wiring at the parallel wiring groups.

The repair portions of the first wires may include sections with which those of the second wires are not overlapped. With the structure, laser repairs are easily carried out.

Where two neighboring first wires are short-circuited, the repair portions are cut off at both ends of either one of such neighboring first wires. Likewise, in the case that two neighboring second wires are short-circuited, the repair portions are cut off at both ends of either one of such two neighboring second wires.

The redundant wiring apparatus of the invention may be applied to display devices which include a display region on the isolation substrate, switching circuits provided in the display region, pixel electrodes, output terminals and a sealing region surrounding the display region.

A plurality of wiring groups are provided to connect the switching circuits with the pixel electrodes and the output terminals and the redundant wires of the wiring group are provided between one end thereof in the sealing region and the other end near the output terminals.

The layout of the redundant wires is complicated and heavy in density. Thus, the wires require the redundant structure to avoid or repair open- and/or short-circuited wiring troubles. The redundant wires are basically comprised of first wires formed between the insulation substrate and the insulation layer and second wires formed on the insulation layer. The first and second wires further include repair portions, respectively, in the vicinity of both ends of either one of the first and second wires. The repair portions of the first wires preferably have sections with which those of the second wire are not overlapped.

In this redundant wiring apparatus, if first wires of neighboring wiring groups are short-circuited, the repair portions at both ends of the first wires are cut off. Similarly, where the second wires of neighboring wiring groups are short-circuited, the repair portions at both ends of either the second wires are cut off.

A method of making a redundant wiring apparatus of the present invention includes the steps of preparing an insulation substrate, forming an insulation layer, forming a plurality of wiring groups, each of which includes first wires formed between the insulation substrate and the insulation layer and second wires formed on the insulation layer, the first and second wires having repair portions in the vicinity of both ends of either one of the first and second wires, and forming connectors in order to electrically connect the first wires with the second wires at such both ends as set forth above. In such a redundant wiring apparatus as made by this method, an open- or short-circuited wiring trouble happens in the neighboring wiring groups, it is easily repaired by laser-cutting of the repair portions as mentioned above in connection with the redundant wiring apparatus.

The above-stated and other objects and technical features of the present invention will become apparent from the following description when taken with the accompanying drawings. It will be understood, however, that the drawings are for the purposes of illustration and are not to be construed as defining the scope of the invention, reference being had for the latter purpose to the claims appended hereto.

EXPLANATION OF PREFERRED EMBODIMENT

Figure 1:
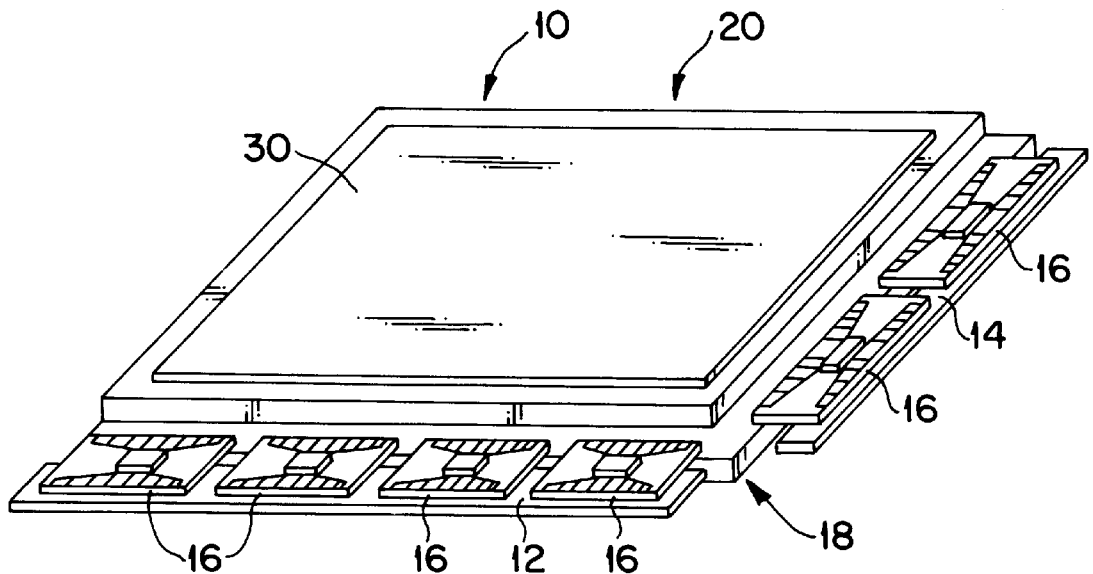
FIG. 1 is a perspective view of a liquid crystal display device to which a redundant wiring apparatus of the present invention is applied.

Embodiments of a redundant wiring apparatus and a method of making the same of the invention will be explained hereinafter with reference to the attached drawings. A liquid crystal display device is disclosed as a first embodiment of the redundant wiring apparatus. As shown in FIG. 1, the liquid crystal display device includes a liquid crystal display panel 10, a signal line driving circuit board 12, a scanning line driving circuit board 14 and a tape carrier package (TCP) 16 to electrically connect the liquid crystal display panel with each of the circuit boards.

Figure 2:
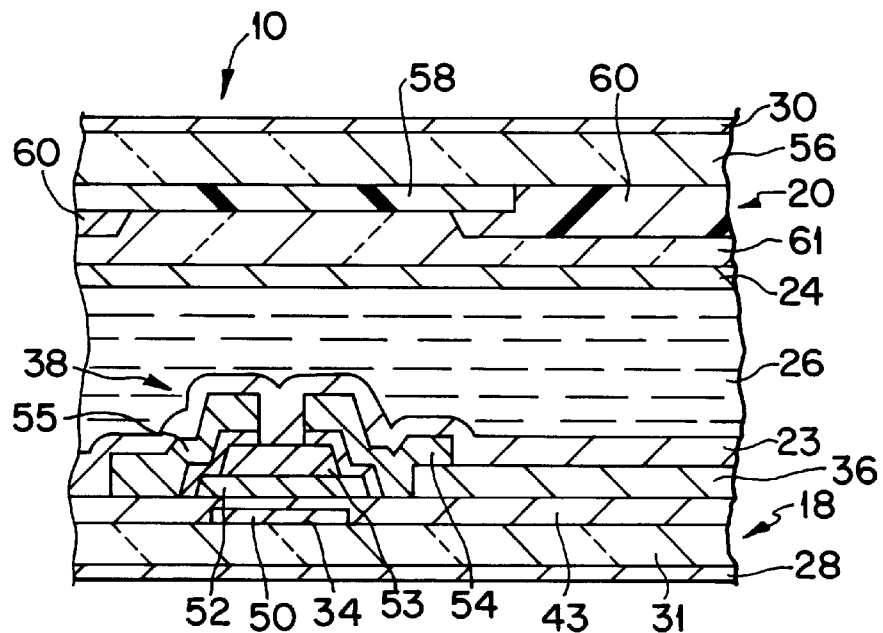
FIG. 2 is a cross sectional view of the liquid crystal display device shown in FIG. 1.

As shown in FIGS. 1 and 2, the liquid crystal display panel 10 is provided with a switching circuit array substrate 18 and a counter substrate 20. Alignment layers 23 and 24 are disposed on the inner surfaces of these substrates, respectively. The substrates are bonded to each other at their peripheral portions by a sealing material (to be described later) so that a predetermined gap is defined between the alignment layers of the substrates. A liquid crystal composition 26 is enclosed between the gap of the alignment layers. Polarlizers 28 and 30 are put on the outer surfaces of the array substrate 18 and the counter substrate 20, respectively.

Figure 3:
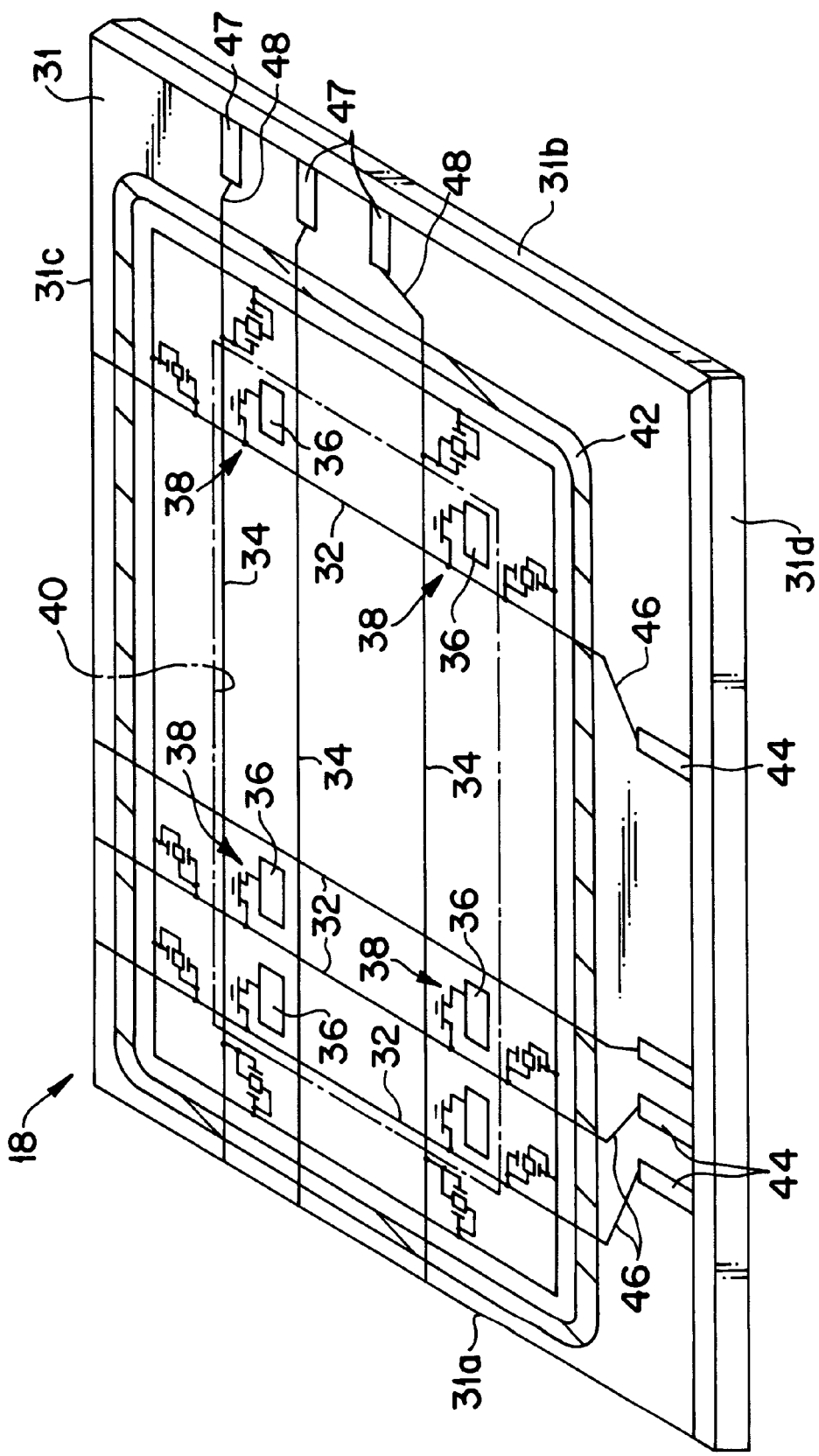
FIG. 3 is a schematic perspective view of the thin film transistor array substrate shown in FIG. 1.

The array substrate 18 includes a 0.7 mm thick glass plate 31, as shown in FIGS. 2 and 3, and 800×3 signal lines and 600 scanning lines are provided on the glass plate in a matrix form. Indium tin oxide (ITO) pixel electrodes 36 are disposed in the regions surrounded by the signal and scanning lines 32 and 34. The pixel electrodes 36 are connected to the signal and scanning lines 32 and 34 through thin film transistors (TFTs) 38.

A substantially rectangular display region 40 is defined by a plurality of the pixel electrodes 36. A sealing region 42 is provided to surround the display region 40 on the glass plate 31. The sealing material may be made of ultraviolet hardening resins.

Each scanning line 34 is made of a metal material with low electric resistance, such as a molybdenum tungsten (Mo-W) alloy. The scanning lines 34 each extend between the shorter sides 31a and 31b of the glass plate 31. The scanning lines 34 are disposed to cross over the sealing region 42 and are connected to lead wires 48 drawn to scanning lines connection pads 47 at the shorter side 31b. The connection pads 47 are further connected to the scanning line driving circuit board 14 through the TCP 16.

The signal lines 32 are disposed on the scanning lines 34 to cross the same through a gate insulation layer 43 made of silicon nitride. The signal lines 32 extend between the longer sides 31c and 31d on the glass plate 31.

The signal lines 32 are disposed to cross over the sealing region 42 and are connected to lead wires 46 drawn to signal lines connection pads 44 at the longer side 31d. The connection pads 44 are further connected to the signal line driving circuit board 12 through the TCP 16.

As illustrated in FIG. 2, each TFT 38 includes a gate electrode 50 made of a part of the scanning line 34 and an a-Si:H semiconductor layer 52 formed on the gate electrode through the gate insulation layer 43. A silicon nitride channel protection layer 53 is formed on the semiconductor layer 52 by a self-alignment process using the scanning line 34 as a mask pattern.

The semiconductor layer 52 is electrically connected to the pixel electrode 36 through a source electrode 54 and is also connected to signal line 32 through a drain electrode 55. The semiconductor layer 52 may be composed of a polycrystalline silicon or chemical compound semiconductor layer.

In the array substrate 18 of the liquid crystal display panel, the lead wires 46 and 48 of the signal and scanning lines 32 and 34 are of two laminated-layer (parallel wiring) structures, respectively. FIGS. 5(a), 5(b) and 5(c) are cross-sectional views cut along lines A—A, B—B and C—C in FIG. 4.

The lead wires 46 of the signal lines 32 will be explained hereinafter with reference to FIGS. 4 and 5. The wires 46 consist of first wires 46a made of Mo-W alloy materials on the glass plate 31 and second wires 46b made of aluminum (Al) alloy materials. The second wires 46b are overlapped with the first wires 46a through the gate insulation layer 43.

The first and second wires 46a and 46b are mutually conductive due to connectors provided in contact-through holes 64 at two points between which the sealing region 42 is disposed, i.e., at one point in the display region 40 and at the other point near the signal line connection pads 44.

The lead wire 46 has repair portions 66 in the vicinities of such two points as stated above. The repair portions are provided with parts of the first and second wires 46a and 46b which are preferably not overlapped. For instance, the second wire 46b is slightly deviated from the first wire 46a in the plan view of the glass plate 31 to make a detour 46c as shown in FIGS. 4 and 5(a) through 5(c). The redundant wiring structure, however, may be reversed with respect to the first and second wires so that the first wires 46a are in place of the second wires 46a and vice versa.

Since the lead wire 46 of the signal line 32 has such redundant structure of two laminated layers or parallel wiring, even if either one of the first and second wires is open-circuited due to dust stuck in the production process, another wire maintains its connection and is prevented from open-circuited wiring. Thus, the reliability on avoidance of open-circuited wiring is improved.

Now, the narrowest space ranging from 10 μm to 20 μm between the neighboring lead wires 46 is extremely narrower than that ranging from 50 μm to 100 μm between the neighboring wires in the display region. The possibility of short-circuited wiring between the lead wires 46 is quite high.

Figures 6A, 6B:
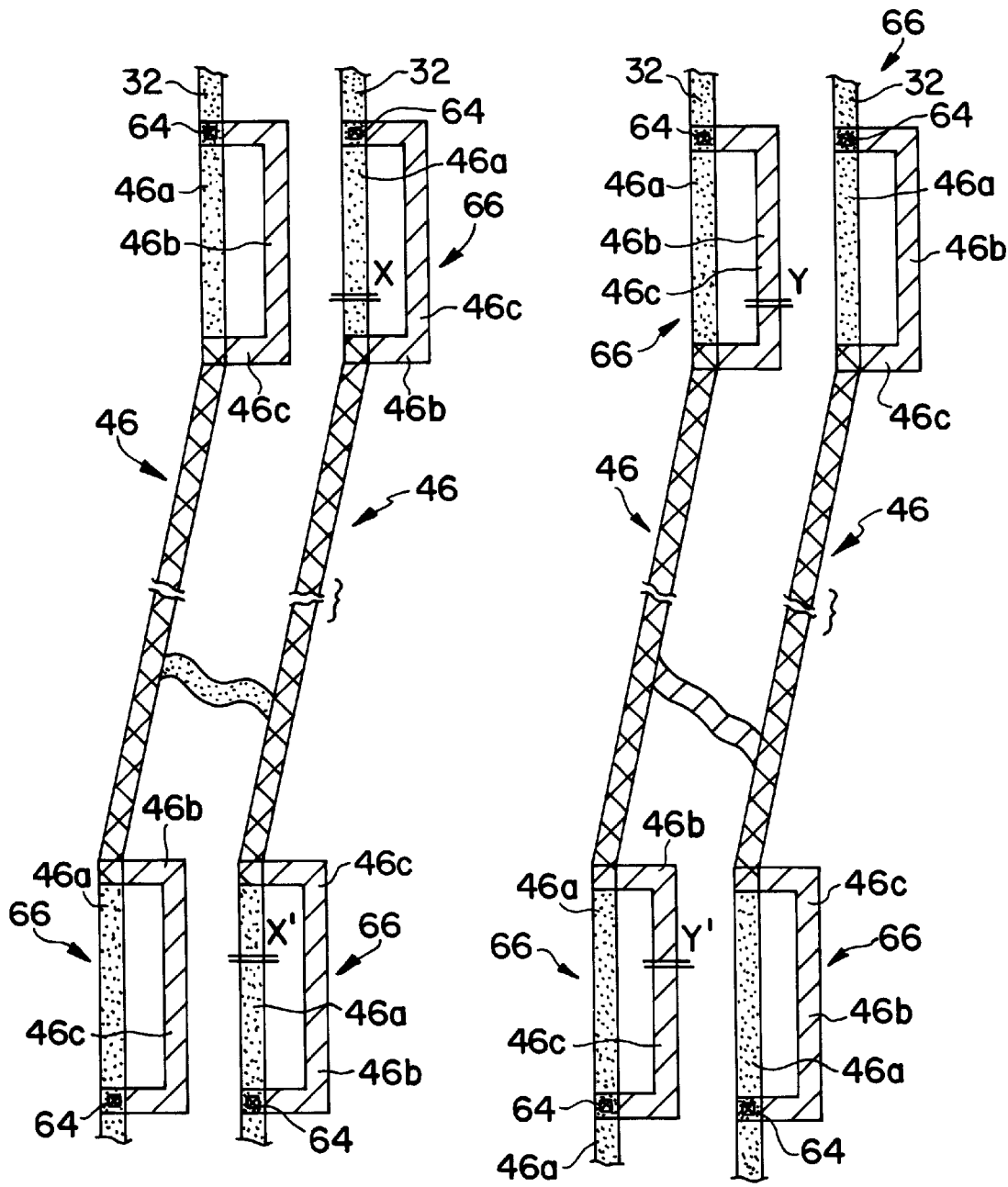
FIGS. 6(a) and 6(b) are schematic cross sectional views of the redundant wiring apparatus shown in FIG. 4 and of its short-circuited troubles.

The redundant wiring apparatus of this invention can prevent the lead wires from such short-circuited wiring. When the first wires 46a of the lead wires 46 of neighboring signal lines 32 are, for instance, short-circuited as shown in FIG. 6(a), two points X and X' at two repair portions 66 of the first wires 46a are cut off by irradiating laser beams. Thus, the short-circuited wiring at the first wires 46a can be repaired.

In the case of wiring troubles, the repair portion on one of the two laminated-layer (parallel) wires is cut off by using laser beams as explained above. Since, however, the repair portions 66 of either one of the first and second wires 46a and 46b are not overlapped with those of the corresponding ones in this embodiment, a repairing operation can be more easily carried out.

The short-circuited wiring is detected in the final step of the array substrate production process by an inspection test probe which is electrically coupled to the signal and scanning line connection pads 44 and 47 to measure electric characteristics of the wires. Generally speaking, short-circuited lead wires can be easily specified, but it is difficult to judge whether the short-circuited wiring trouble takes place between the first wires or between the second wires.

In accordance with the present embodiment, however, when the short-circuit of neighboring lead wires 46 is detected, the repairing operation is completed without any accompanying open-circuited wiring by cutting points X and X' of the first wires 46a, and Y and Y' of the second wires 46b at the neighboring lead wires 46 at the same time because it is equivalent to a combination of the repairing operations shown in FIGS. 6(a) and 6(b). Thus, in the case where short-circuited lead wires are detected at the final step of the array substrate production process, points X and X' of the first wires 46a, and Y and Y' of the second wires 46b at the lead wires 46 are unconditionally cut off as shown in FIG. 4.

Figure 4:
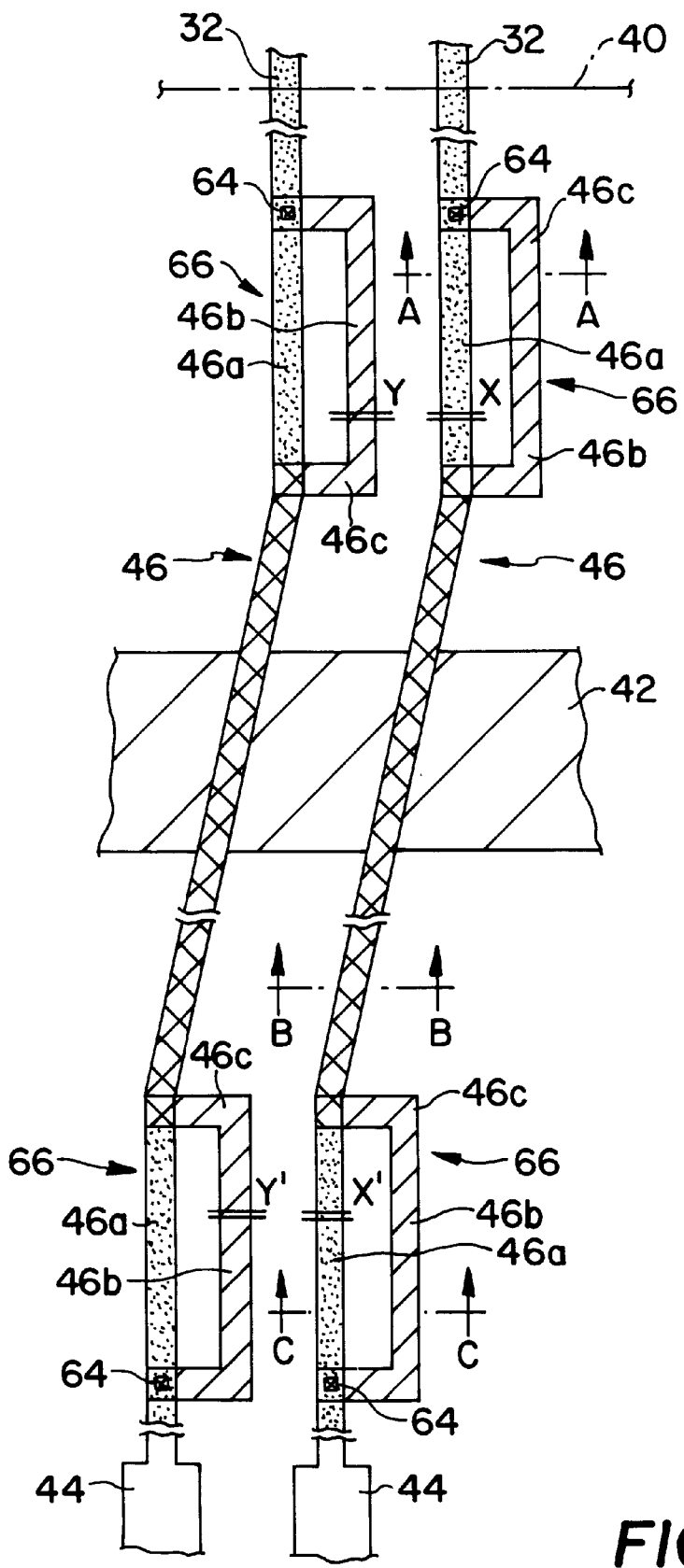
FIG. 4 is a schematic partial plan view of the redundant wiring apparatus.
Figure 5A:
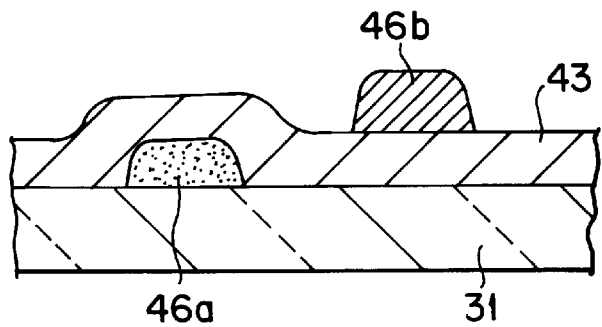
FIGS. 5(a) through 5(c) are cross sectional views of repair portions cut along A—A, B—B and C—C in FIG. 4.
Figure 5B:
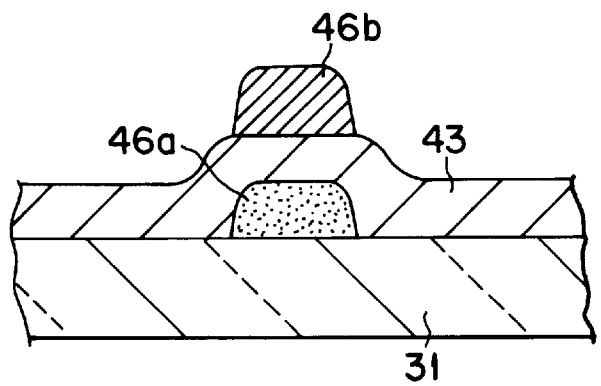
Figure 5C:
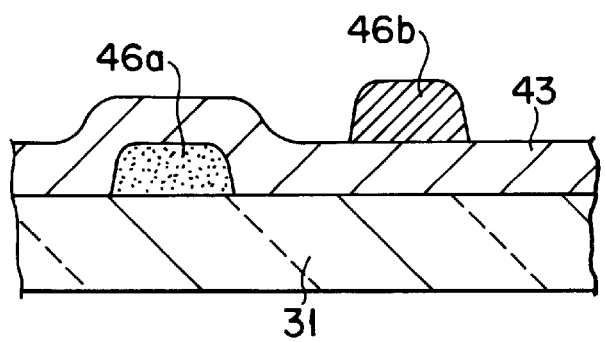

It is desirable that pairs of the cutting points X and Y, and X' and Y' are set closely at the neighboring lead wires, respectively, as shown in FIG. 4. With those settings, the irradiation of laser beams continuously cuts either points X and Y or X' and Y' at a time.

The lead wires 48 of the scanning line 34 may consist of the components similar to those 46 of the signal lines 32 to repair short-circuited wiring between neighboring lead wires 48 in the substantially same way as in the lead wires 46.

On the other hand, as shown in FIG. 2, the counter substrate 20 includes a transparent glass plate 56 functioning as a second insulation substrate. On the glass plate 56 a light blocking layer 58 made of a chrome oxide is formed in a matrix. The light blocking layer 58 prevents light from passing through the TFTs 38, gaps between the signal lines 32 and the pixel electrodes 36, and gaps between the scanning lines 34 and the pixel electrodes 36.

Further, red, green and blue color filter layers 60 are disposed opposite to the pixel electrodes 36 on the array substrate 36. A transparent electrode 61 made of an indium tin oxide (ITO) material is formed on the light blocking layer 58 and the color filter layers 60. The ITO electrode is coated with an alignment layer 24.

After the inspection and the repairing operation of the array substrate, the sealing material is applied to the sealing region 42 on the array substrate 18 and the array substrate 18 is fixed with the counter substrate 20. The liquid crystal composition 26 is enclosed in the spaces defined between the array and counter substrates 18 and 20 so that the liquid crystal display panel 10 is produced.

According to the liquid crystal display device, the occurrence of open-circuited wiring troubles can be substantially reduced by the laminated layer structure of the lead wires 46 and 48. In addition, since the lead wires 46 and 48 include the repairing portions at the both ends, short-circuited wiring between the first or second wires at neighboring lead wires can be easily repaired by cutting the repairing portions.

The repairing portions 66 are provided on the both sides of the sealing region 42 and with the laminated layer structure. Thus, where the sealing region is coated with ultraviolet hardening type sealing materials and the sealing region is irradiated by ultraviolet beams through the lead wires 46 and 48, the occurrence of the sealing regions where the ultraviolet beams do not reach due to the lead wires is reduced. As a result, sealing strength decreases and position errors of the array and counter substrates can be substantially avoided.

As described above in detail, a redundant wiring apparatus of the present invention includes such a structure that short-circuited wiring troubles between lead wires can be easily repaired while open-circuited wiring troubles are significantly reduced. Thus, the redundant wiring apparatus and a method of making the same provide, in particular, a switching circuit array substrate of a liquid crystal display device with high quality, low production cost and high yield.

What I claim is:

1. A wiring apparatus comprising:
    an insulation substrate;
    an insulation layer formed on said insulation substrate; and
    a plurality of redundant wiring groups, each group including:
        a first continuous wire formed between said insulation substrate and said insulation layer;
        a second continuous wire disposed along said first wire and formed on said insulation layer;
        first and second connectors structured to electrically connect said first continuous wire with said second continuous wire at both end portions thereof; and
        first and second repairing portions provided between said first and second connectors, the repairing portions being adapted for repairing at least one of the first and second continuous wires;
    wherein said first continuous wire is not overlapped with said second continuous wire at said first and second repairing portions; and
    wherein, in the case that said first continuous wires in neighboring ones of said wiring groups are short-circuited, one of said short-circuited first continuous wires is cut off at said first and second repairing portions thereof.

2. A redundant wiring apparatus comprising:
    an insulation substrate;

an insulation layer formed on said insulation substrate;

a plurality of wiring groups, each group including a first wire formed between said insulation substrate and said insulation layer and a second wire disposed along said first wire and formed on said insulation layer; and first and second connectors to electrically connect said first wire with said second wire at both end portions of each of said wiring groups, respectively;

wherein at least one of said first and second wires includes first and second repairing portions provided between said first and second connectors of each of said wiring groups;

wherein said first wire is not overlapped with said second wire at said first and second repairing portions; and wherein, when said second wires in neighboring ones of said wiring groups are short-circuited, one of said short-circuited second wires is cut off at the first and second repairing portions thereof.

3. A redundant wiring apparatus comprising:

an insulation substrate;

an insulation layer formed on said insulation substrate;

a plurality of wiring groups, each group including a first wire formed between said insulation substrate and said insulation layer and a second wire disposed along said first wire and formed on said insulation layer; and first and second connectors to electrically connect said first wire with said second wire at both end portions of each of said wiring groups, respectively;

wherein at least one of said first and second wires includes first and second repairing portions provided between said first and second connectors of each of said wiring groups;

wherein said first wire is not overlapped with said second wire at said first and second repairing portions; and wherein, when the first and second wires in neighboring ones of said wiring groups are short-circuited, said short-circuited first wire in one of said neighboring groups and said short-circuited second wire in the other of said neighboring groups are respectively cut off at the first and second repairing portions thereof.

4. A redundant wiring apparatus comprising:

an insulation substrate;

an insulation layer formed on said insulation substrate;

a plurality of wiring groups, each group including a first wire formed between said insulation substrate and said insulation layer and a second wire disposed along said first wire and formed on said insulation layer; and first and second connectors to electrically connect said first wire with said second wire at both end portions of each of said wiring groups, respectively;

wherein at least one of said first and second wires includes first and second repairing portions provided between said first and second connectors of each of said wiring groups;

wherein said first wire is not overlapped with said second wire at said first and second repairing portions; and wherein, when a short circuit occurs at neighboring ones of said wiring groups, the first wire in one of said neighboring groups and the second wire in the other of said neighboring groups are respectively cut off at the first and second repairing portions thereof to repair said short circuit.

* * * * *